(12) United States Patent
Ogura et al.

(10) Patent No.: US 11,662,204 B2
(45) Date of Patent: May 30, 2023

(54) VIBRATOR DEVICE

(71) Applicant: SEIKO EPSON CORPORATION, Tokyo (JP)

(72) Inventors: Seiichiro Ogura, Minowa-machi (JP); Keiichi Yamaguchi, Ina (JP); Ryuta Nishizawa, Nagano (JP)

(73) Assignee: SEIKO EPSON CORPORATION, Tokyo (JP)

( * ) Notice: Subject to any disclaimer, the term of this patent is extended or adjusted under 35 U.S.C. 154(b) by 371 days.

(21) Appl. No.: 17/155,418

(22) Filed: Jan. 22, 2021

(65) Prior Publication Data

US 2021/0231438 A1 Jul. 29, 2021

(30) Foreign Application Priority Data

Jan. 24, 2020 (JP) .............................. JP2020-009799

(51) Int. Cl.
*H03H 9/21* (2006.01)
*G01C 19/5628* (2012.01)

(52) U.S. Cl.
CPC ........... *G01C 19/5628* (2013.01); *H03H 9/21* (2013.01)

(58) Field of Classification Search
CPC ................................................. G01C 19/5628
See application file for complete search history.

(56) References Cited

U.S. PATENT DOCUMENTS

| | | | |
|---|---|---|---|
| 7,112,914 B1 * | 9/2006 | Dalla Piazza ............ | H03H 9/21 310/370 |
| 10,673,408 B2 * | 6/2020 | Goto ..................... | B06B 1/0603 |
| 11,444,235 B2 * | 9/2022 | Ogura .................. | H10N 30/304 |
| 2009/0256449 A1 * | 10/2009 | Nishimura ........... | H03H 9/0519 29/25.35 |
| 2011/0221309 A1 * | 9/2011 | Umeki ............... | H03H 9/02023 29/25.35 |
| 2012/0043859 A1 * | 2/2012 | Ichikawa ................. | H03H 9/21 29/25.35 |
| 2013/0335157 A1 * | 12/2013 | Ishii ..................... | H03H 9/1021 310/365 |
| 2018/0274922 A1 | 9/2018 | Nishizawa et al. | |
| 2019/0101566 A1 * | 4/2019 | Inaba .................. | G01C 19/5628 |

FOREIGN PATENT DOCUMENTS

| | | | |
|---|---|---|---|
| JP | 2011-155339 | | 8/2011 |
| JP | 2013-207527 | | 10/2013 |
| JP | 2017092724 A | * | 5/2017 |
| JP | 2018-159674 | | 10/2018 |

* cited by examiner

*Primary Examiner* — J. San Martin
(74) *Attorney, Agent, or Firm* — Rankin, Hill & Clark LLP (57) ABSTRACT

A vibrator device includes a vibrating body having a first surface, a package having a second surface opposed to the first surface of the vibrating body, a circuit board provided to the package so as to be opposed to the first surface of the vibrating body, a plurality of coupling electrodes provided to the first surface of the vibrating body, a first coupling line provided to the second surface of the package, a second coupling line provided to the circuit board, and a bonding material electrically coupling the coupling electrode and the first coupling line to each other, wherein the vibrating body has a protrusion protruding toward the package farther than the coupling electrode at the first surface side, and the protrusion has contact with the second surface of the package.

7 Claims, 11 Drawing Sheets

VIBRATOR DEVICE

The present application is based on, and claims priority from JP Application Serial Number 2020-009799, filed Jan. 24, 2020, the disclosure of which is hereby incorporated by reference herein in its entirety.

BACKGROUND

1. Technical Field

The present disclosure relates to a vibrator device.

2. Related Art

In JP-A-2018-159674, there is disclosed a vibrator device which has a vibrator element, a relay substrate for supporting the vibrator element, and a package for fixing the relay substrate, and in which fixation parts provided to both ends of the relay substrate are fixed with an adhesive to an upper stage surface provided to a base member of the package to thereby reduce transmission of a thermal stress occurring in the package or a stress caused by an impact or the like received by the package to the vibrator element to reduce a variation of the vibration characteristics.

However, in the vibrator device described in Document 1, there is a possibility that the distance between the relay substrate and the package varies due to the variation in thickness of the adhesive when installing the relay substrate in the package. Therefore, there is a problem that capacitances occurring between electrode lines on the relay substrate and wiring lines in the package, and between the electrode lines on the relay substrate and wiring lines of a circuit board varies, and it is difficult to achieve a design taking the capacitances into consideration.

SUMMARY

A vibrator device includes a vibrating body having a first surface, a package having a second surface opposed to the first surface of the vibrating body, a circuit board provided to the package so as to be opposed to the first surface of the vibrating body, a plurality of coupling electrodes provided to the first surface of the vibrating body, a first coupling line provided to the second surface of the package, a second coupling line provided to the circuit board, and a bonding material electrically coupling the coupling electrode and the first coupling line to each other, wherein the vibrating body has a protrusion protruding toward the package farther than the coupling electrode at the first surface side, and the protrusion has contact with the second surface of the package.

DESCRIPTION OF EXEMPLARY EMBODIMENTS

1. First Embodiment

First, a vibrator device 1 according to a first embodiment will be described with reference to FIG. 1 through FIG. 7 citing a vibrator device having the vibrating body having the vibrator element mounted on the support substrate as an example.

It should be noted that an X axis, a Y axis, and a Z axis in the drawings are axes perpendicular to each other, wherein a direction extending along the X axis is defined as an "X direction," a direction extending along the Y axis is defined as a "Y direction," and a direction extending along the Z axis is defined as a "Z direction," and directions with arrows are positive directions. Further, the description will be presented defining the positive direction in the Z direction as an "upper side," and the negative direction in the Z direction as a "lower side." Further, in FIG. 1, a plan view seen through a lid 22 is used for the sake of convenience of explanation. Further, in FIG. 1 and FIG. 2, wiring lines and electrodes provided to a support substrate 4 and a vibrator element 6 are omitted from the illustration.

Figure 1:
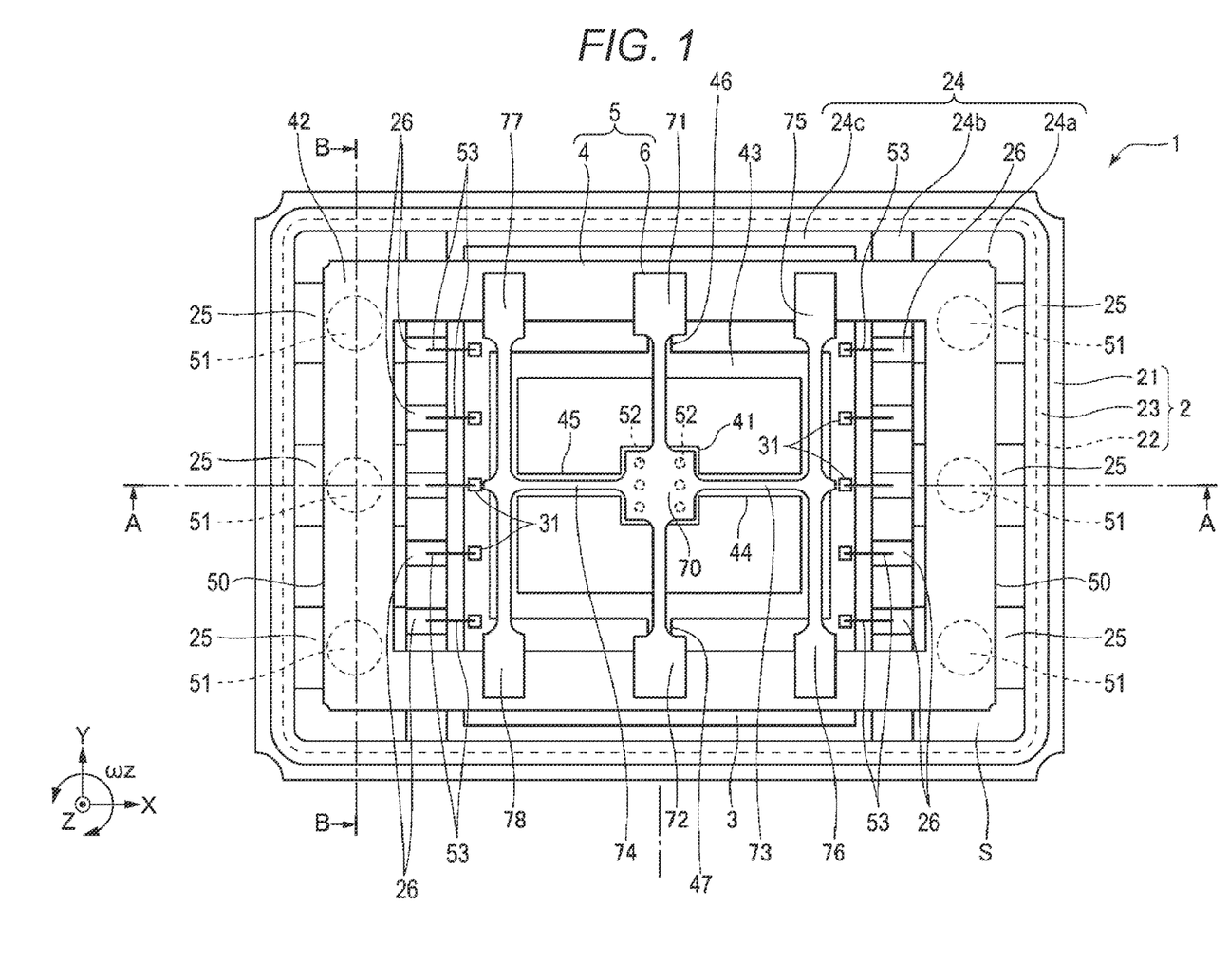
FIG. 1 is a plan view showing a schematic configuration of a vibrator device according to a first embodiment.
Figure 2:
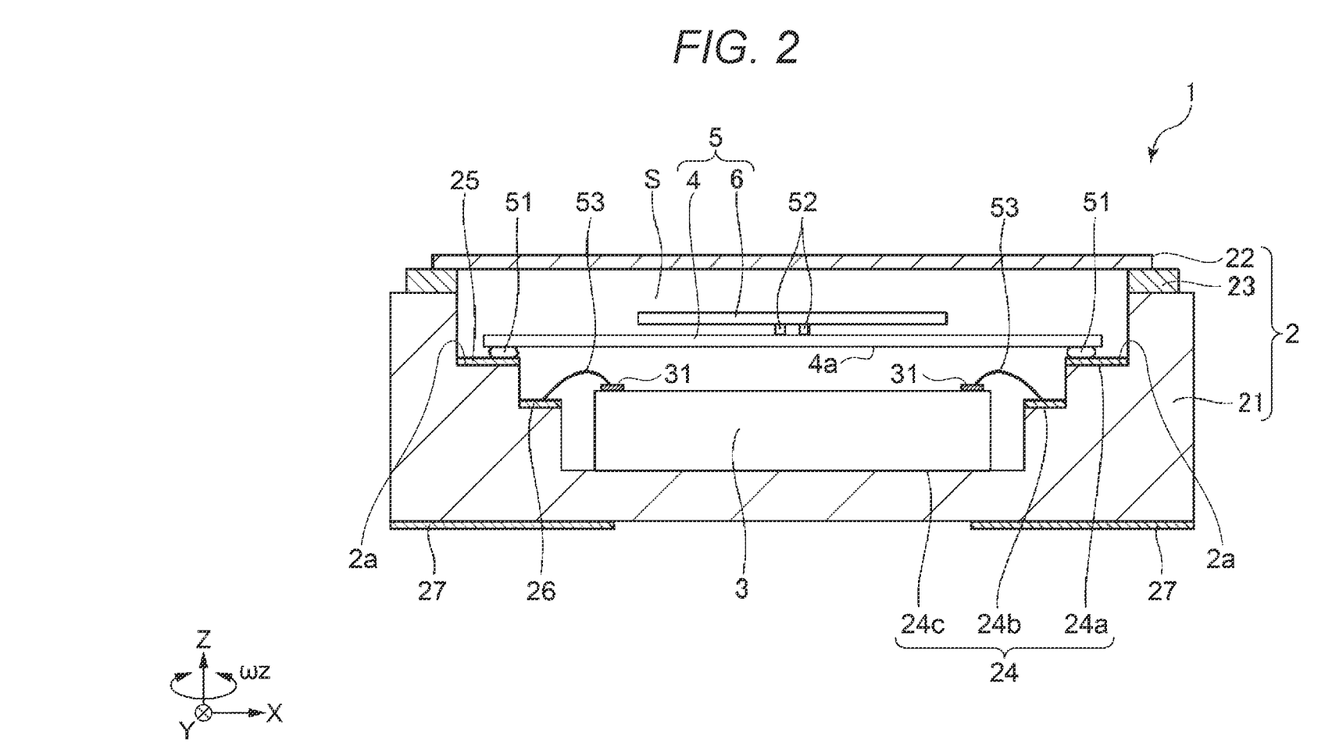
FIG. 2 is a cross-sectional view along the line A-A shown in FIG. 1.
Figure 3:
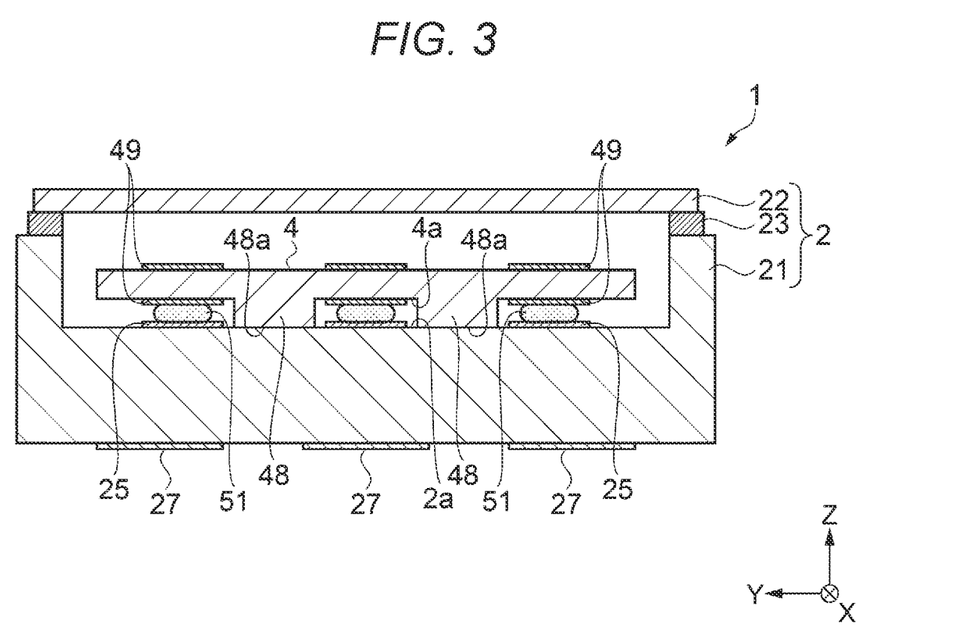
FIG. 3 is a cross-sectional view along the line B-B shown in FIG. 1.

The vibrator device 1 according to the present embodiment is a physical quantity sensor for detecting angular velocity ωz defining the Z axis as the detection axis. As shown in FIG. 1, FIG. 2, and FIG. 3, the vibrator device 1 has a package 2, and a vibrating body 5 and a circuit element 3 as a circuit board housed in the package 2. It should be noted that the vibrating body 5 includes the support substrate 4 and the vibrator element 6, wherein the vibrator element 6 is supported on the support substrate 4.

The package 2 has a base 21 provided with a recessed part 24 opening in an upper surface, and the lid 22 which is bonded to an upper surface of a base 21 via a bonding member 23 so as to close the opening of the recessed part 24. The recessed part 24 forms an internal space S inside the package 2, and the vibrating body 5 and the circuit element 3 are housed in the internal space S. For example, the base 21 can be formed of ceramics such as alumina, and the lid 22 can be formed of a metal material such as kovar. It should be noted that the constituent materials of the base 21 and the lid 22 are not particularly limited.

The internal space S is airtightly sealed, and is set in a reduced-pressure state, and more preferably a state approximate to a vacuum state. Thus, the viscosity resistance reduces and the vibration characteristics of the vibrator element 6 are improved. It should be noted that the atmosphere in the internal space S is not particularly limited, but can be, for example, in the atmospheric pressure state or a pressurized state.

Further, the recessed part 24 is constituted by a plurality of recessed parts 24a, 24b, and 24c arranged side by side in the Z direction, and has the recessed part 24a opening in the upper surface of the base 21, the recessed part 24b which opens in a bottom surface of the recessed part 24a and is smaller in opening width than the recessed part 24a, and the recessed part 24c which opens in a bottom surface of the recessed part 24b and is smaller in opening width than the recessed part 24b. Further, to a second surface 2a as the bottom surface of the recessed part 24a, there is fixed the support substrate 4 for the vibrating body 5, and to the bottom surface of the recessed part 24c, there is fixed the circuit element 3.

Further, on the second surface 2a of the recessed part 24a, there is disposed internal terminals 25 as a plurality of first coupling lines, on the bottom surface of the recessed part 24b, there is disposed a plurality of internal terminals 26, and on the lower surface of the base 21, there is disposed a plurality of external terminals 27. The internal terminals 25, 26 and the external terminals 27 described above are electrically coupled to each other via wiring lines not shown formed inside the base 21. Further, as shown in FIG. 3, the internal terminals 25 are electrically coupled to terminals 49 as coupling electrodes provided to the support substrate 4 via bonding materials 51 having electrical conductivity. Further, the internal terminals 26 are electrically coupled to terminals 31 as second coupling lines disposed on the circuit element 3 via bonding wires 53.

The circuit element 3 is fixed to the bottom surface of the recessed part 24c. The circuit element 3 includes a drive circuit for driving the vibrator element 6 and a detection circuit for detecting the angular velocity ωz applied to the vibrator element 6.

As shown in FIG. 3, in the vibrator device 1, the terminals 49 provided to a first surface 4a of the support substrate 4 are fixed with the adhesive on the internal terminals 25 provided to the second surface 2a of the recessed part 24a via bonding materials 51 such as electrically-conductive adhesive. Further, the first surface 4a at both ends in the X direction of the support substrate 4 is provided with a plurality of protrusions 48 each protruding toward the package 2 farther than the terminals 49, and a surface 48a of each of the protrusions 48 opposed to the second surface 2a of the recessed part 24a has contact with the second surface 2a of the recessed part 24a constituting the package 2. It should be noted that the surface 48a having contact with the second surface 2a of the protrusion 48 is parallel to the second surface 2a.

Further, since the plurality of protrusions 48 is disposed along sides 50 at both ends of the support substrate 4, by fixing with the adhesive the support substrate 4 and the recessed part 24a of the package 2 to each other in the state in which the surfaces 48a of the protrusions 48 have contact with the second surface 2a of the recessed part 24a, the protrusions 48 function as a stopper, and thus, the distance between the first surface 4a of the support substrate 4 and the bottom surface of the recessed part 24 in the package 2 can be made constant. Therefore, the capacitances formed between the plurality of terminals 49 provided to the first surface 4a of the support substrate 4 and the internal terminals 25 provided to the bottom surface of the recessed part 24a in the package 2, and between a plurality of wiring lines 9 described later and provided to a surface at an opposite side to the first surface 4a of the support substrate 4 and terminals 31 of the circuit element 3 mounted on the bottom surface of the recessed part 24c in the package 2 can be made constant, and it becomes easy to achieve the design taking the capacitances into consideration.

The vibrating body 5 includes the vibrator element 6 and the support substrate 4 disposed between the vibrator element 6 and the package 2, and supports the vibrator element 6 on the support substrate 4 via the bonding material 52 as shown in FIG. 2.

Figure 4:
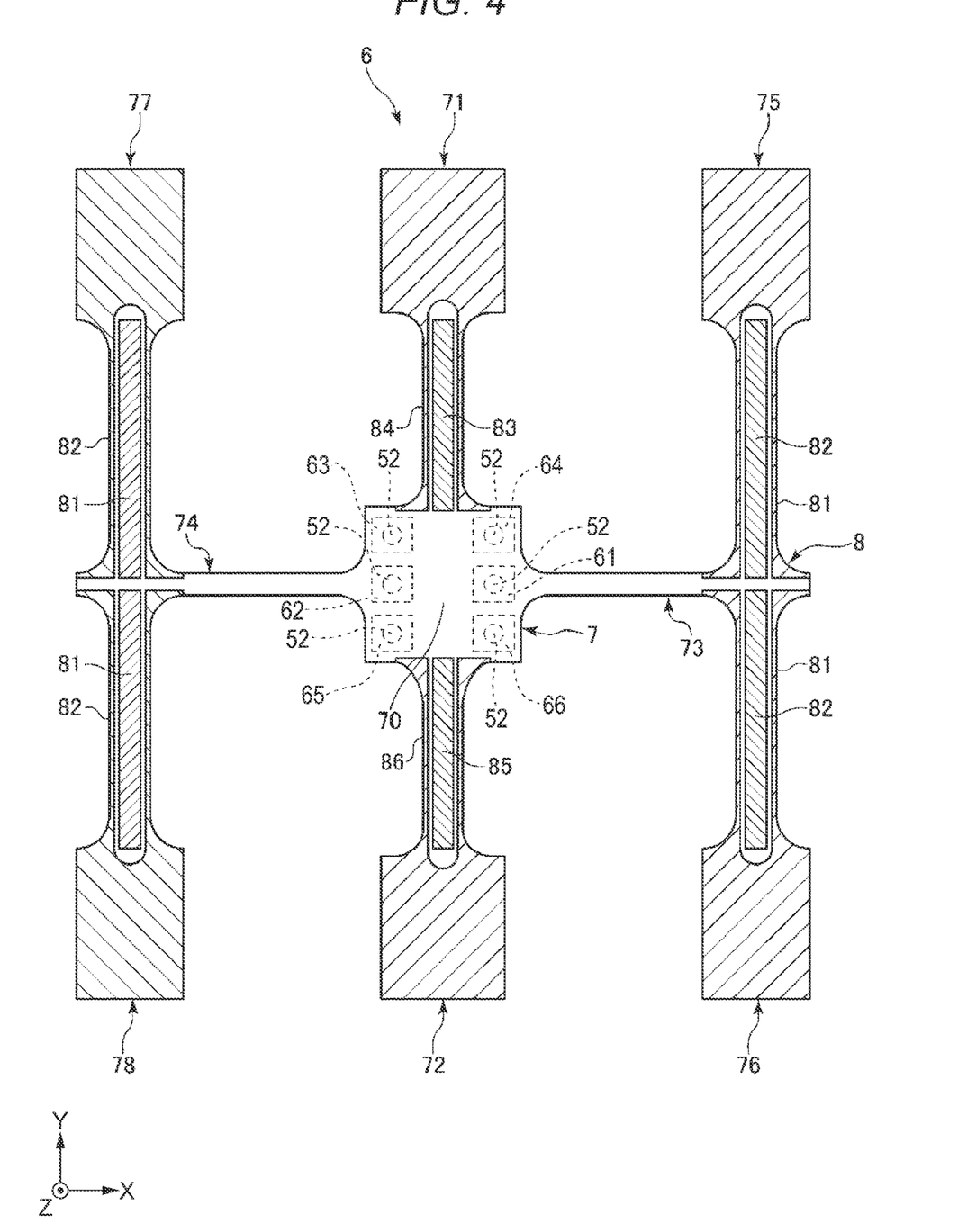
FIG. 4 is a plan view showing a vibrator element provided to a vibrating body shown in FIG. 1.
Figure 5:
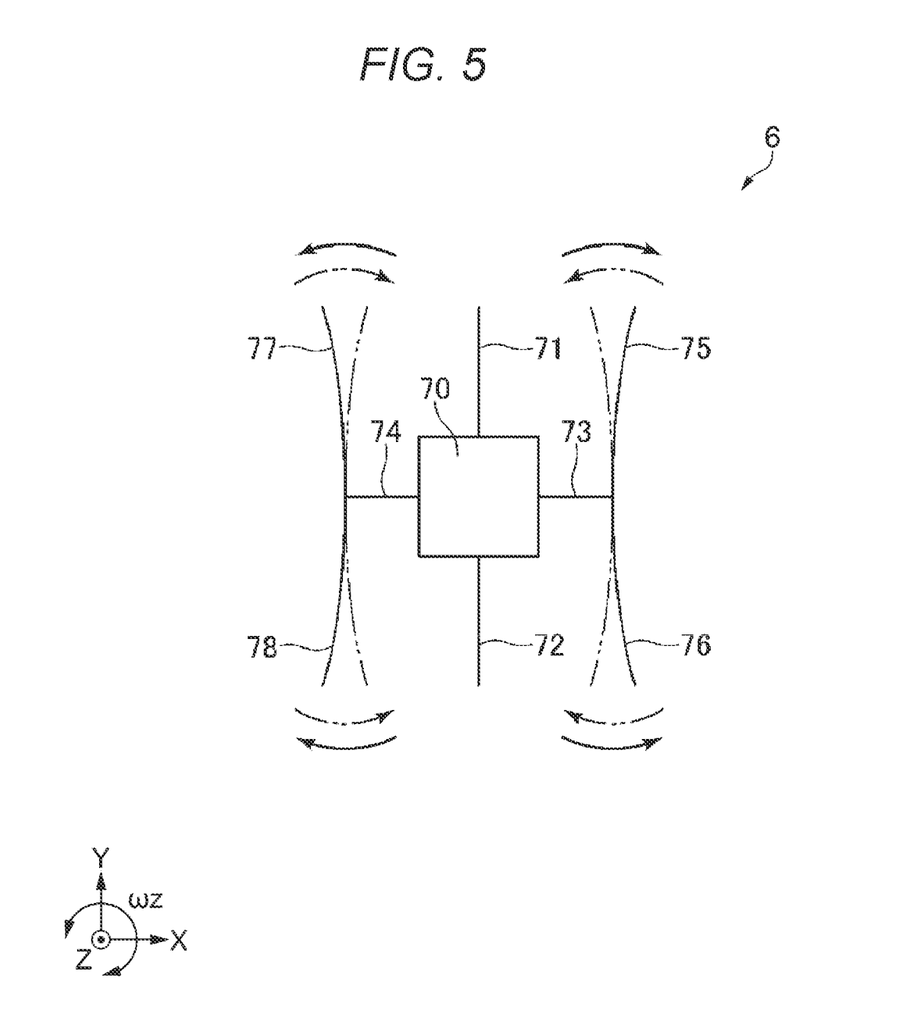
FIG. 5 is a schematic diagram for explaining drive of the vibrator element shown in FIG. 4.

The vibrator element 6 is an angular velocity sensor element capable of detecting the angular velocity ωz defining the Z axis as the detection axis as the physical quantity sensor element. As shown in FIG. 4, the vibrator element 6 has a vibrating substrate 7, and electrodes 8 disposed on a surface of the vibrating substrate 7. The vibrating substrate 7 is formed of a Z-cut quartz crystal substrate. The Z-cut quartz crystal substrate has spread in an X-Y plane defined by an X axis as an electrical axis and a Y axis as a mechanical axis, and has a thickness in a direction along a Z axis as an optical axis, wherein the electrical axis, the mechanical axis, and the optical axis are crystal axes of quartz crystal.

The vibrating substrate 7 has a base part 70 located in a central portion, detection arms 71, 72 as a pair of detection parts extending toward both sides in the Y direction from the base part 70, a pair of coupling arms 73, 74 extending toward both sides in the X direction from the base part 70, drive arms 75, 76 as a pair of drive parts extending toward both sides in the Y direction from a tip part of the coupling arm 73, and drive arms 77, 78 as a pair of drive parts extending toward both sides in the Y direction from a tip part of the coupling arm 74.

As shown in FIG. 4, the electrodes 8 include drive electrodes 81, drive ground electrodes 82, first detection electrodes 83 as detection electrodes, first detection ground electrodes 84, second detection electrodes 85 as the detection electrodes, and second detection ground electrodes 86.

The drive electrodes 81 are disposed on both side surfaces of each of the drive arms 75, 76, and an upper surface and a lower surface of each of the drive arms 77, 78. Meanwhile, the drive ground electrodes 82 are disposed on an upper surface and a lower surface of each of the drive arms 75, 76, and both side surfaces of each of the drive arms 77, 78. Further, the first detection electrodes 83 are disposed on an upper surface and a lower surface of the detection arm 71, and the first detection ground electrodes 84 are disposed on both side surfaces of the detection arm 71. Meanwhile, the second detection electrodes 85 are disposed on an upper surface and a lower surface of the detection arm 72, and the second detection ground electrodes 86 are disposed on both side surfaces of the detection arm 72.

Further, these electrodes 81 through 86 are each laid around to a lower surface of the base part 70. Further, as shown in FIG. 4, on the lower surface of the base part 70, there are disposed a terminal 61 electrically coupled to the drive electrodes 81, a terminal 62 electrically coupled to the drive ground electrodes 82, a terminal 63 electrically coupled to the first detection electrodes 83, a terminal 64 electrically coupled to the first detection ground electrodes 84, a terminal 65 electrically coupled to the second detection electrodes 85, and a terminal 66 electrically coupled to the second detection ground electrodes 86.

Figure 6:
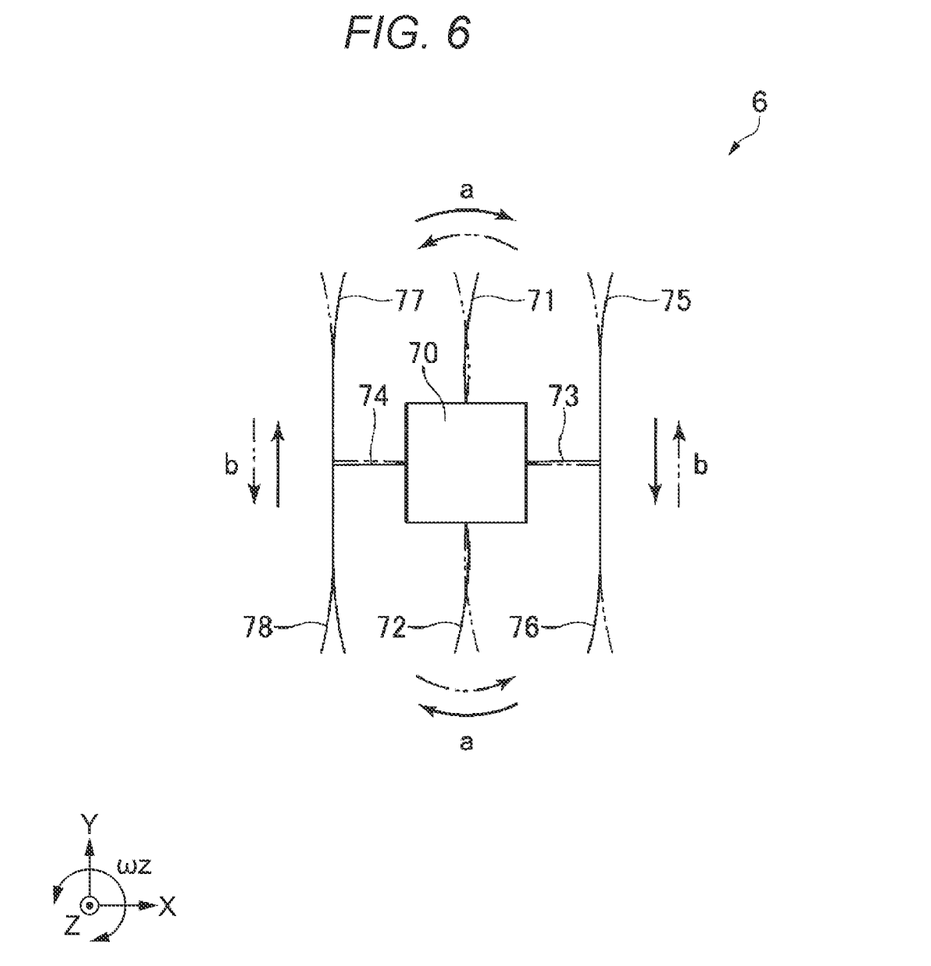
FIG. 6 is a schematic diagram for explaining drive of the vibrator element shown in FIG. 4.

Such a vibrator element 6 detects the angular velocity ωz in the following manner. First, when applying a drive signal between the drive electrodes 81 and the drive ground electrodes 82, the drive arms 75 through 78 flexurally vibrate as represented by the arrows shown in FIG. 5. Hereinafter, this drive mode is referred to as a drive vibration mode. Further, when the angular velocity ωz is applied to the vibrator element 6 in the state of performing the drive in the drive vibration mode, a detection vibration mode shown in FIG. 6 is newly excited. In the detection vibration mode, a Coriolis force acts on the drive arms 75 through 78 to excite the vibration in a direction represented by the arrows b, and in concert with this vibration, the detection vibration due to the flexural vibration occurs in a direction represented by the arrows a in the detection arms 71, 72. A charge generated in the detection arm 71 due to such a detection vibration mode is taken out between the first detection electrodes 83 and the first detection ground electrodes 84 as a first detection signal, a charge generated in the detection arm 72 is taken out between the second detection electrodes 85 and the second detection ground electrodes 86 as a second detection signal, and it is possible to detect the angular velocity ωz based on these first and second detection signals.

Figure 7:
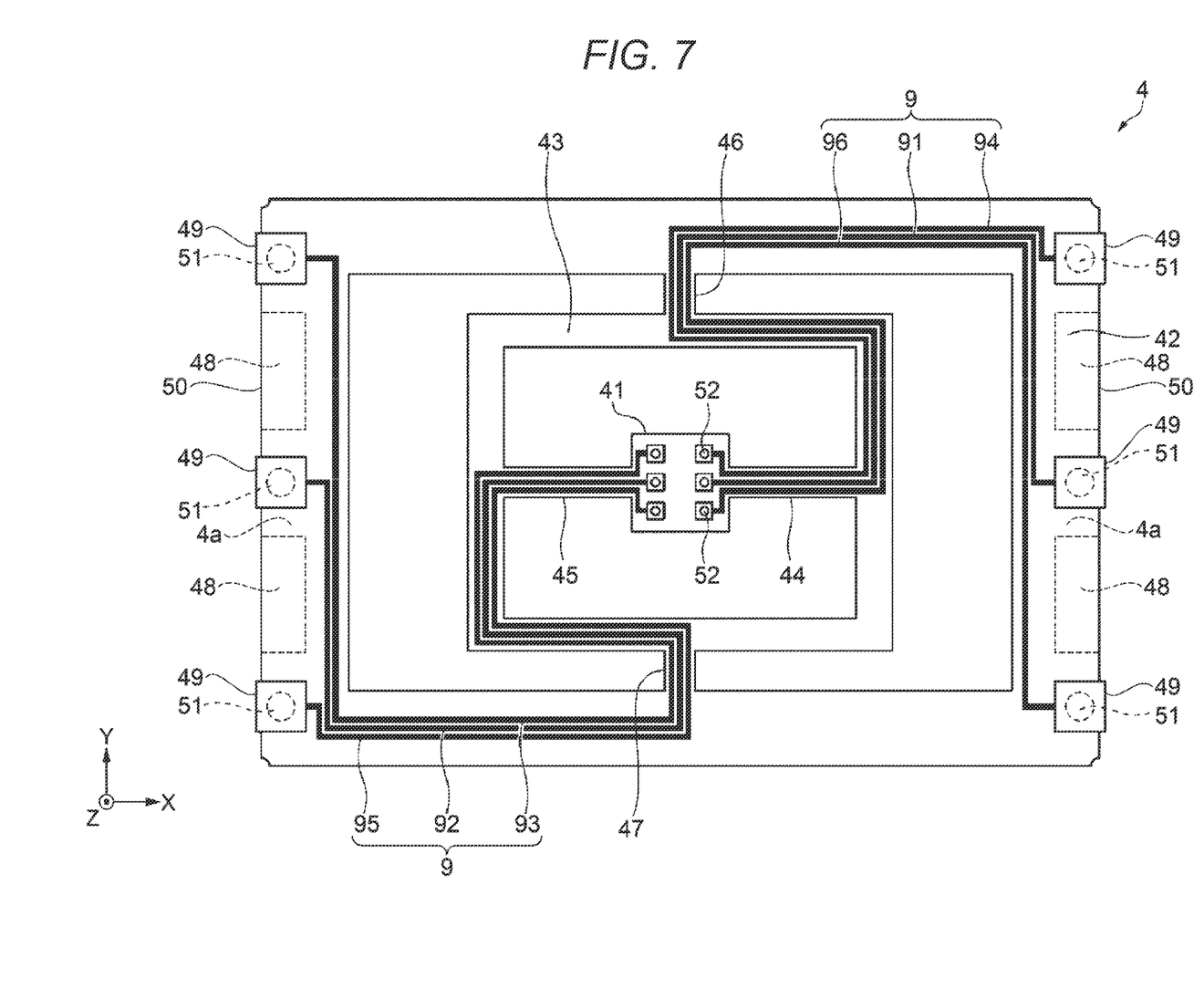
FIG. 7 is a plan view showing a support substrate provided to the vibrating body shown in FIG. 1.

The support substrate 4 is formed of the quartz crystal substrate with the same cutting angle as that in the vibrating substrate 7. The support substrate 4 has a gimbal structure, and has an element mount part 41, a support part 42, a frame part 43, a pair of inner beam parts 44, 45, and a pair of outer beam parts 46, 47, wherein the vibrator element 6 is mounted on the element mount part 41, the support part 42 is located outside the element mount part 41, fixed to the base 21, and has a frame-like shape, the frame part 43 is located between the element mount part 41 and the support part 42, and has a frame-like shape surrounding the element mount part 41, the pair of inner beam parts 44, 45 extend toward both sides in the X direction from the element mount part 41 to couple the element mount part 41 and the frame part 43 to each other, and the pair of outer beam parts 46, 47 extend toward both sides in the Y direction from the frame part 43 to couple the frame part 43 and the support part 42 to each other in a plan view from the Z direction as shown in FIG. 7.

Further, the support substrate 4 has the plurality of protrusions 48 protruding toward the negative Z direction at the first surface 4a side of both ends in the X direction of the support part 42. The plurality of protrusions 48 is disposed along the sides 50 at the both ends of the support part 42 between the terminals 49 as the plurality of coupling electrodes.

Further, the support substrate 4 is provided with a plurality of wiring lines 9 electrically coupling the electrodes 81 through 86 of the vibrator element 6 and the internal terminals 25 in the package 2 to each other. The plurality of wiring lines 9 includes a drive wiring line 91 and a drive ground wiring line 92 as a drive wiring line, a first detection wiring line 93 as a detection wiring line, a first detection ground wiring line 94, a second detection wiring line 95 as a detection wiring line, a second detection ground wiring line 96, and the terminals 49. Therefore, the support substrate 4 is provided with two driving wiring lines, four detecting wiring lines, and six terminals used for coupling to the internal terminals 25 in the package 2. Further, these wiring lines 91 through 96 are each laid around to the element mount part 41 and the support part 42 through the inner beam parts 44, 45, the frame part 43, and the outer beam parts 46, 47. It should be noted that the wiring lines 9 correspond to the coupling electrodes in the present embodiment.

Further, the drive wiring line 91 is electrically coupled to the terminal 61, namely the drive electrodes 81, via the bonding material 52 on the element mount part 41, and is electrically coupled to the internal terminal 25 via the bonding material 51 in the terminal 49 disposed in the end part of the support part 42. Further, the drive ground wiring line 92 is electrically coupled to the terminal 62, namely the drive ground electrodes 82, via the bonding material 52 on the element mount part 41, and is electrically coupled to the internal terminal 25 via the bonding material 51 in the terminal 49 disposed in the end part of the support part 42.

Further, the first detection wiring line 93 is electrically coupled to the terminal 63, namely the first detection electrodes 83, via the bonding material 52 on the element mount part 41, and is electrically coupled to the internal terminal 25 via the bonding material 51 in the terminal 49 disposed in the end part of the support part 42. Further, the first detection ground wiring line 94 is electrically coupled to the terminal 64, namely the first detection ground electrodes 84, via the bonding material 52 on the element mount part 41, and is electrically coupled to the internal terminal 25 via the bonding material 51 in the terminal 49 disposed in the end part of the support part 42.

Further, the second detection wiring line 95 is electrically coupled to the terminal 65, namely the second detection electrodes 85, via the bonding material 52 on the element mount part 41, and is electrically coupled to the internal terminal 25 via the bonding material 51 in the terminal 49 disposed in the end part of the support part 42. Further, the second detection ground wiring line 96 is electrically coupled to the terminal 66, namely the second detection ground electrodes 86, via the bonding material 52 on the element mount part 41, and is electrically coupled to the internal terminal 25 via the bonding material 51 in the terminal 49 disposed in the end part of the support part 42.

Thus, the vibrator element 6 and the circuit element 3 are electrically coupled to each other via these wiring lines 91 through 96. It should be noted that the bonding materials 51, 52 are not particularly limited providing both of the electrical conductivity and the bonding property are provided, and there can be used, for example, an electrically-conductive adhesive, or a variety of types of metal bumps such as a gold bump or a solder bump.

Among the six wiring lines 91 through 96, the drive wiring line 91, the first detection ground wiring line 94, and the second detection ground wiring line 96 are each laid around from the element mount part 41 to the terminal 49 disposed in the end part of the support part 42 through the inner beam part 44, the frame part 43, and the outer beam part 46. Further, the drive ground wiring line 92, the first detection wiring line 93, and the second detection wiring line 95 are each laid around from the element mount part 41 to the terminal 49 disposed in the end part of the support part 42 through the inner beam part 45, the frame part 43, and the outer beam part 47. It should be noted that the terminal 49 provided to the first surface 4a of the support substrate 4 and the terminal 49 provided to the surface at the opposite side to the first surface 4a, namely an upper surface of the support substrate 4, are electrically coupled to each other with a side surface electrode provided to the side surface of the support substrate 4.

In the vibrator device 1 according to the present embodiment, the first surface 4a opposed to the package 2 at both ends of the support substrate 4 supporting the vibrator element 6 is provided with the plurality of protrusions 48 each protruding toward the package 2 farther than the terminals 49, and the surface 48a of each of the protrusions 48 opposed to the second surface 2a of the recessed part 24a has contact with the second surface 2a of the recessed part 24a constituting the package 2. Therefore, by fixing with the adhesive the support substrate 4 and the recessed part 24a of the package 2, the protrusions 48 function as the stopper, and the distance between the first surface 4a of the support substrate 4 and the bottom surface of the recessed part 24 in the package 2 can be made constant. Therefore, the capacitances formed between the coupling electrodes such as the plurality of terminals 49 provided to the first surface 4a of the support substrate 4 and the first coupling lines such as the internal terminals 25 provided to the bottom surface of the recessed part 24a in the package 2, and between the coupling electrodes such as the plurality of wiring lines 9 provided to the surface at the opposite side to the first surface 4a of the support substrate 4 and the second coupling lines such as the terminals 31 of the circuit element 3 mounted on the bottom surface of the recessed part 24c in the package 2 can be made constant, and it is possible to make it easy to achieve the design taking the capacitances into consideration.

Further, since the protrusions 48 are provided along the sides 50 at the both ends of the support substrate 4, and are disposed between the terminals 49, the support substrate 4 can be made parallel to the recessed part 24 in the package 2 in both of the X direction and the Y direction, namely the distance between the first surface 4a of the support substrate 4 and the bottom surface of the recessed part 24 in the package 2 can be made constant in both of the directions. Therefore, it is possible to further reduce the variation of the capacitances.

Further, since the surfaces 48a having contact with the second surface 2a of the protrusions 48 are parallel to the second surface 2a, the distance between the bottom surface of the recessed part 24 in the package 2 and the first surface 4a of the support substrate 4 can be made more constant and it is possible to further reduce the variation of the capacitances.

Further, since at least one of the terminals 49 is the drive wiring line 91 electrically coupled to the drive electrodes 81, and at least one of the terminals 49 is one of the detection wiling lines 93, 95 electrically coupled respectively to the detection electrodes 83, 85, it is possible to detect the angular velocity ωz by driving the drive parts of the vibrator element 6 with the circuit element 3 in the package 2 and then processing the detection signal output from the detection parts with the circuit element 3.

2. Second Embodiment

Then, a vibrator device 1a according to a second embodiment will be described with reference to FIG. 8 and FIG. 9. It should be noted that FIG. 8 and FIG. 9 correspond to apart located at the positive Y direction side and the negative X direction side out of the four corners inside the package 2 in FIG. 1.

The vibrator device 1a according to the present embodiment is substantially the same as the vibrator device 1 according to the first embodiment except the fact that a structure of protrusions 480a of a support substrate 40a is different compared to the vibrator device 1 according to the first embodiment. It should be noted that the description will be presented with a focus on the difference from the first embodiment described above, and the description of substantially the same issues will be omitted.

Figure 8:
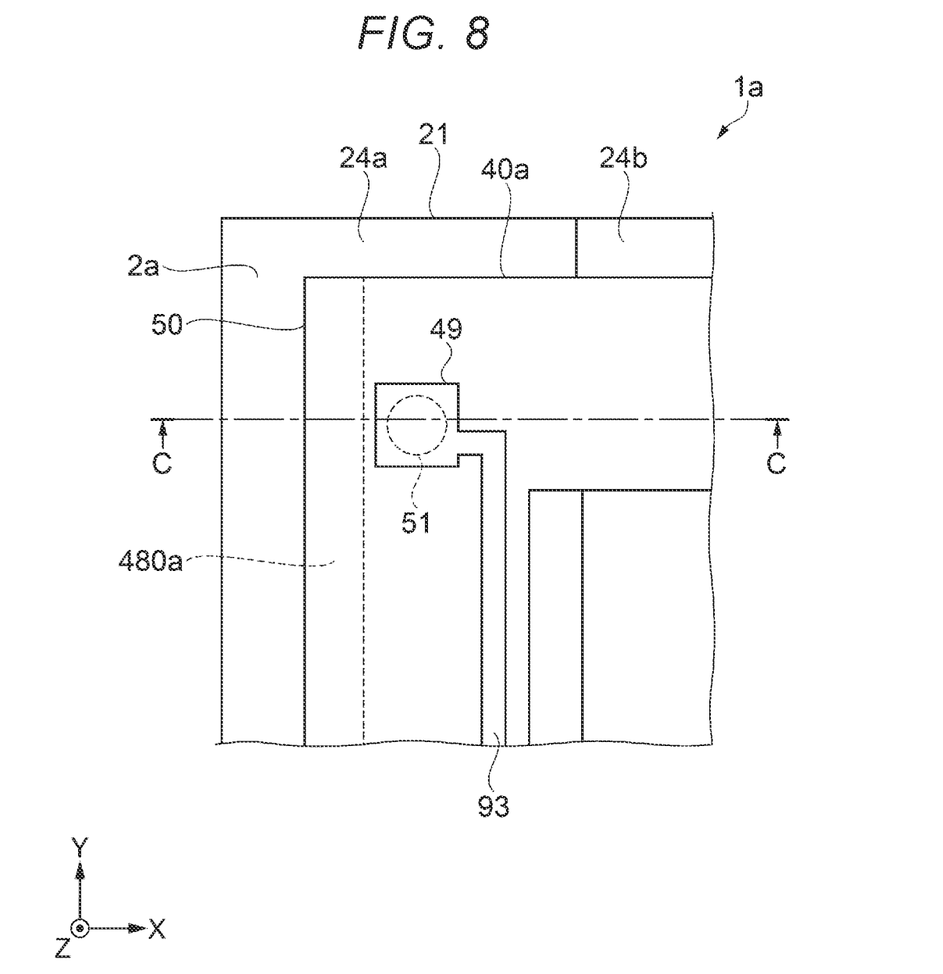
FIG. 8 is a plan view showing a schematic configuration of a vibrator device according to a second embodiment.
Figure 9:
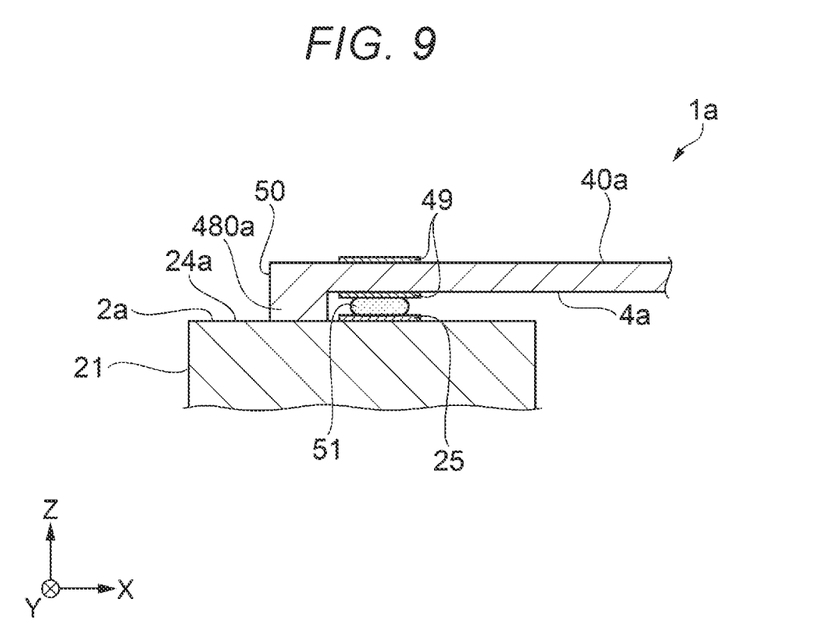
FIG. 9 is a cross-sectional view along the line C-C shown in FIG. 8.

As shown in FIG. 8 and FIG. 9, the protrusions 480a provided to the support substrate 40a of the vibrator device 1a are disposed along the side 50 of the support substrate 40a, and each have a rectangular shape having long sides in the Y direction, and each protrude toward the negative Z direction. Further, the protrusion 480a is disposed between the side 50, and the internal terminal 25 and the terminal 49 bonded to each other with the bonding material 51. It should be noted that the protrusion 480a is also disposed between the side 50, and the internal terminal 25 and the terminal 49 in the end part at the positive X direction side of the support substrate 40a.

By adopting such a configuration, there can be obtained substantially the same advantages as those of the vibrator device 1 according to the first embodiment.

3. Third Embodiment

Then, a vibrator device 1b according to a third embodiment will be described with reference to FIG. 10 and FIG. 11. It should be noted that FIG. 10 and FIG. 11 correspond to a part located at the positive Y direction side and the negative X direction side out of the four corners inside the package 2 in FIG. 1 similarly to FIG. 8 and FIG. 9 described above.

The vibrator device 1b according to the present embodiment is substantially the same as the vibrator device 1 according to the first embodiment except the fact that a structure of a protrusion 480b of a support substrate 40b is different compared to the vibrator device 1 according to the first embodiment. It should be noted that the description will be presented with a focus on the difference from the first embodiment described above, and the description of substantially the same issues will be omitted.

Figure 10:
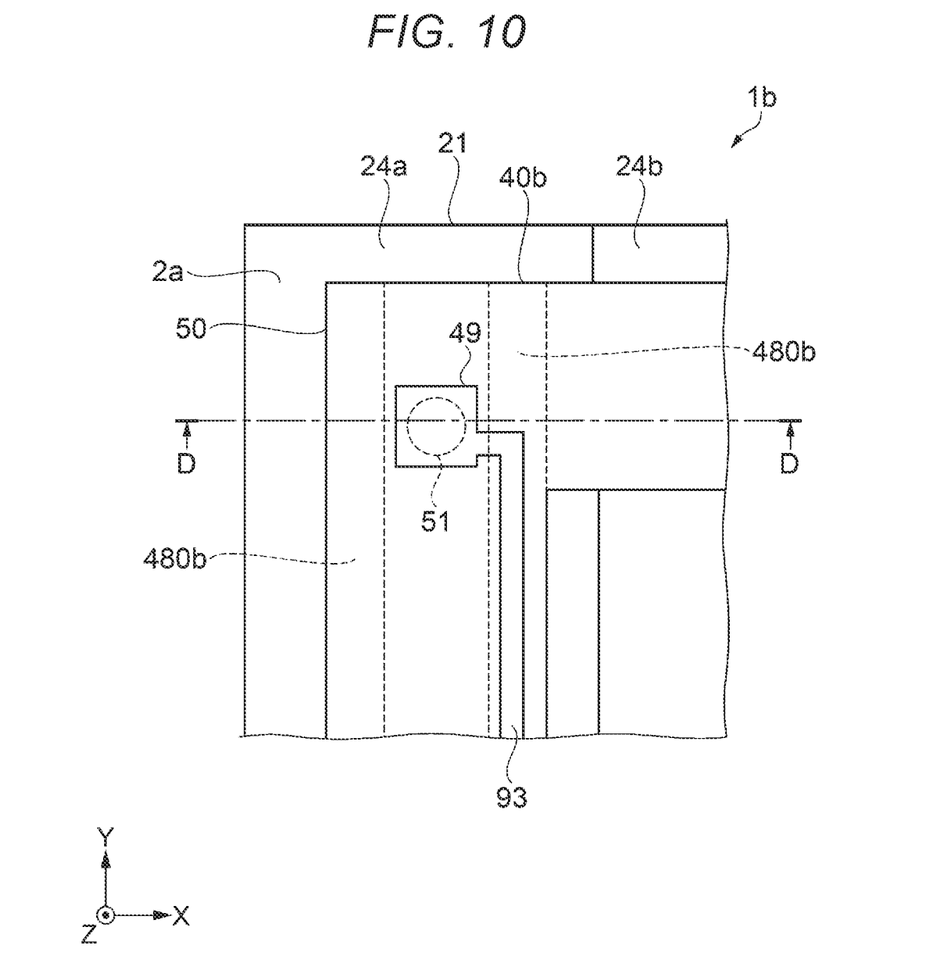
FIG. 10 is a plan view showing a schematic configuration of a vibrator device according to a third embodiment.
Figure 11:
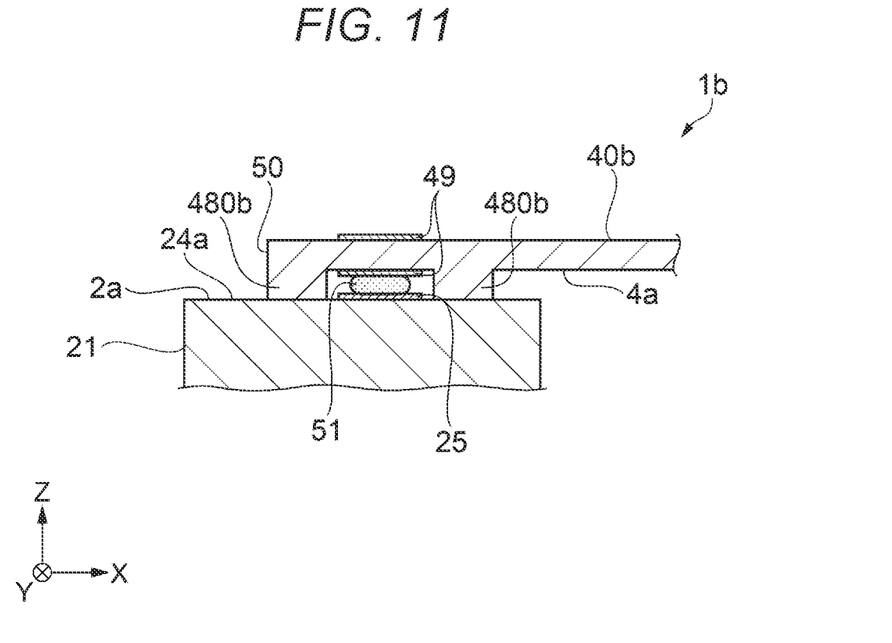
FIG. 11 is a cross-sectional view along the line D-D shown in FIG. 10.

As shown in FIG. 10 and FIG. 11, the protrusions 480b provided to the support substrate 40b of the vibrator device 1b each have a rectangular shape having long sides in the Y direction, and each protrude toward the negative Z direction. Further, the protrusions 480b are disposed along the side 50 of the support substrate 40b at both sides in the X direction of the internal terminal 25 and the terminal 49 bonded to each other with the bonding material 51. In other words, two protrusions 480b are disposed along the side 50 across the internal terminal 25 and the terminal 49. It should be noted that the two protrusions 480b are also disposed across the internal terminal 25 and the terminal 49 in the end part at the positive X direction side of the support substrate 40b.

By adopting such a configuration, there can be obtained substantially the same advantages as those of the vibrator device 1 according to the first embodiment.

What is claimed is:

1. A vibrator device comprising:
  a vibrating body having a first surface;
  a package having a second surface opposed to the first surface of the vibrating body;
  a circuit board provided to the package so as to be opposed to the first surface of the vibrating body;
  a plurality of coupling electrodes provided to the first surface of the vibrating body;
  a first coupling line provided to the second surface of the package;
  a second coupling line provided to the circuit board; and
  a bonding material electrically coupling the coupling electrode and the first coupling line to each other, wherein
  the vibrating body has a protrusion protruding toward the package farther than the coupling electrode at the first surface side, and
  the protrusion has contact with the second surface of the package.

2. The vibrator device according to claim 1, wherein the vibrating body includes
  a drive part provided with a drive electrode, and
  a detection part provided with a detection electrode,
  at least one of the coupling electrodes is a drive wiring line electrically coupled to the drive electrode, and
  at least one of the coupling electrodes is a detection wiring line electrically coupled to the detection electrode.

3. The vibrator device according to claim 1, wherein the protrusion is provided to each of both ends of the vibrating body.

4. The vibrator device according to claim 3, wherein a plurality of the protrusions is disposed along sides at the both ends of the vibrating body.

5. The vibrator device according to claim 3, wherein the protrusion is disposed between the coupling electrodes.

6. The vibrator device according to claim 1, wherein a surface of the protrusion having contact with the second surface is parallel to the second surface.

7. The vibrator device according to claim 1, wherein the vibrating body includes a vibrator element, and a support substrate disposed between the vibrator element and the package, and the protrusion is provided to the support substrate.

* * * * *